United States Patent
Lee et al.

(10) Patent No.: US 9,390,967 B2
(45) Date of Patent: Jul. 12, 2016

(54) METHOD FOR RESIDUE-FREE BLOCK PATTERN TRANSFER ONTO METAL INTERCONNECTS FOR AIR GAP FORMATION

(71) Applicants: International Business Machines Corporation, Armonk, NY (US); STMicroelectronics, Inc., Coppell, TX (US)

(72) Inventors: Joe Lee, Albany, NY (US); Yann Mignot, Slingerlands, NY (US); Brown C. Peethala, Albany, NY (US)

(73) Assignees: International Business Machines Corporation, Armonk, NY (US); STMICROELECTRONICS, INC., Coppell, TX (US)

( * ) Notice: Subject to any disclaimer, the term of this patent is extended or adjusted under 35 U.S.C. 154(b) by 68 days.

(21) Appl. No.: 14/567,567

(22) Filed: Dec. 11, 2014

(65) Prior Publication Data
US 2016/0172231 A1    Jun. 16, 2016

(51) Int. Cl.
*H01L 21/768* (2006.01)
(52) U.S. Cl.
CPC ...... *H01L 21/7682* (2013.01); *H01L 21/76802* (2013.01); *H01L 21/76843* (2013.01)
(58) Field of Classification Search
CPC .............. H01L 21/6289; H01L 21/764; H01L 27/7682; H01L 23/4821; H01L 29/0649; H01L 29/4991
See application file for complete search history.

(56) References Cited

U.S. PATENT DOCUMENTS

| | | |
|---|---|---|
| 6,713,835 B1 | 3/2004 | Horak et al. |
| 6,917,109 B2 | 7/2005 | Lur et al. |
| 7,531,444 B2 | 5/2009 | Dimitrakopoulos et al. |
| 7,863,150 B2 | 1/2011 | Colburn et al. |
| 7,928,003 B2 | 4/2011 | Naik |
| 7,939,446 B1 | 5/2011 | Clevenger et al. |
| 2005/0074961 A1 | 4/2005 | Beyer et al. |
| 2009/0075470 A1 | 3/2009 | Nitta et al. |
| 2010/0190347 A1 | 7/2010 | Ramachandrarao et al. |
| 2011/0198757 A1 | 8/2011 | Su et al. |
| 2012/0187546 A1* | 7/2012 | Akinmade-Yusuff ............. H01L 21/31144 257/622 |
| 2012/0315755 A1 | 12/2012 | Bartsch et al. |
| 2013/0171829 A1 | 7/2013 | Fitzsimmons et al. |

OTHER PUBLICATIONS

Daamen, R., et al., "Production of 150nm wide Air Gap Interconnects with a "Sacrificial Materials Approach" and a "Close-off Approach"", Technical Note PR-TN 2005/01109, Issued: Dec. 2005, 25 pages.
Loquet, Y., et al., "56 nm pitch Cu dual-damascene interconnects with self-aligned via using negative-tone development Lithography-Etch-Lithography-Etch patterning scheme", Microelectronic Engineering 107, Jul. 2013, pp. 138-144.

* cited by examiner

*Primary Examiner* — Daniel Whalen
*Assistant Examiner* — Suberr Chi
(74) *Attorney, Agent, or Firm* — Scully, Scott, Murphy & Presser, P.C.; Steven J. Meyers

(57) ABSTRACT

A selective wet etching process is used, prior to air gap opening formation, to remove a sacrificial nitride layer from over a first region of an interconnect dielectric material containing a plurality of first conductive metal structures utilizing a titanium nitride hard mask portion located over a second region of the interconnect dielectric material as an etch mask. The titanium nitride hard mask portion located over the second region of the interconnect dielectric material is thereafter removed, again prior to air gap opening formation, utilizing another wet etch process. The wet etching processes are used instead of reactive ion etching.

19 Claims, 8 Drawing Sheets

US 9,390,967 B2

METHOD FOR RESIDUE-FREE BLOCK PATTERN TRANSFER ONTO METAL INTERCONNECTS FOR AIR GAP FORMATION

BACKGROUND

The present application relates to semiconductor device manufacturing, and more particularly, to a method of forming a back-end-of the line (BEOL) interconnect structure having a plurality of conductive metal structures and air gaps within an interconnect dielectric material.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene interconnect structures. The interconnect structure typically includes copper, Cu, or a Cu alloy since Cu-based interconnects provide higher speed signal transmission between large numbers of transistors on a complex semiconductor chip as compared with aluminum, Al,-based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") is achieved in today's IC product chips by embedding the metal lines and metal vias (e.g., conductive metal structures) in an interconnect dielectric material having a dielectric constant of less than 4.0. Dielectric materials having a dielectric constant of less than 4.0 are referred to herein as low k dielectric materials.

Interconnect structures in integrated circuits induce a delay in the propagation of the information between semiconductor devices such as transistors. To reduce this delay, the interconnect structures should possess the lowest capacitance possible. One approach to form interconnect structures with the lowest possible capacitance is to introduce air (or vacuum) gaps into the interconnect dielectric material of the interconnect structure; by replacing a portion of the dielectric material with an air gap, the capacitance can be reduced dramatically.

In prior art interconnect structures, air gaps can be formed into the interconnect dielectric material by utilizing lithography and a reactive ion etch. Pattern transfer using reactive ion etching onto a conductive metal structure/interconnect dielectric material surface for the purposes of forming air gaps is however very difficult due to the formation of a polymer residue and damage induced by ion bombardment. Adjustments to the plasma parameters are limited due to the requirements for material etch selectivity and low sputter damage. Tuning of the chemistry/power setting for the plasma allows for some reduction, but not substantially all, of the damage or polymer residue generation.

As such, there is a need for providing a method of forming air gaps into an interconnect dielectric material without causing the formation of polymer residue and inducing damage into the interconnect structure. In addition, there is also a need for providing a method that can eliminate polymer residue and sputter copper material which can contaminate the plasma etch chamber.

SUMMARY

A selective wet etching process is used, prior to air gap opening formation, to remove a sacrificial nitride layer from over a first region of an interconnect dielectric material containing a plurality of first conductive metal structures utilizing a titanium nitride hard mask portion located over a second region of the interconnect dielectric material as an etch mask. The titanium nitride hard mask portion located over the second region of the interconnect dielectric material is thereafter removed, again prior to air gap opening formation, utilizing another wet etch process. The wet etching processes are used instead of reactive ion etching.

One advantage of not removing the titanium nitride hard mask portion and the sacrificial nitride layer by reactive ion etching is that no polymeric residue forms on the structure or within the reactive ion etching reactor chamber. Such polymeric residues are extremely difficult to remove. Another advantage of not removing the titanium nitride hard mask portion and the sacrificial nitride layer by reactive ion etching is that the plurality of first conductive metal structures is not exposed to any plasma. Exposure of conductive metal structures to reactive ion etching may lead to resputtering of metal within the reactive ion etch chamber and contamination of the interconnect structure itself.

In one aspect of the present application, a method of forming an interconnect structure containing air gaps is provided. In accordance with an embodiment of the present application, the method includes providing a structure having a plurality of first conductive metal structures located in a first region of an interconnect dielectric material and a plurality of second conductive metal structures located in a second region of the interconnect dielectric material. A masking material stack comprising, from bottom to top, a sacrificial nitride layer and a titanium nitride hard mask layer is then formed over the structure. The titanium nitride hard mask layer is removed from over the first region, but not the second region, of the interconnect dielectric material. Next, the sacrificial nitride layer is removed from over the first region of the interconnect dielectric material utilizing a wet etch process, wherein a remaining portion of the titanium nitride hard mask layer located over the second region of the interconnect dielectric material serves as a mask during the wet etch process. The remaining portion of the titanium nitride hard mask layer is then removed from over the second region of the interconnect dielectric material utilizing another wet etch process. Air gap openings are thereafter provided within the first region of the interconnect dielectric material, wherein during the providing the air gap openings a remaining portion of the sacrificial nitride layer is removed from atop the second region of the interconnect dielectric material. Next, a dielectric capping layer is formed over the first region and the second region of the interconnect dielectric material, wherein portions of the dielectric capping layer seal the air gap openings forming air gaps within the first region of the interconnect dielectric material.

In accordance with another embodiment of the present application, the method may include providing a structure having a plurality of first conductive metal structures located in a first region of an interconnect dielectric material and a plurality of second conductive metal structures located in a second region of the interconnect dielectric material. Next, a masking material stack comprising, from bottom to top, a sacrificial nitride layer and a titanium nitride hard mask layer is formed over the structure. The titanium nitride hard mask layer is then removed from over the first region, but not the second region, of the interconnect dielectric material. The sacrificial nitride layer is then removed from over the first region of the interconnect dielectric material utilizing a wet etch process, wherein a remaining portion of the titanium nitride hard mask layer located over the second region of the interconnect dielectric material serves as a mask during the wet etch process. Next, damaged regions are formed within the first region of the interconnect dielectric material. The remaining portion of the titanium nitride hard mask layer is then removed from over the second region of the interconnect dielectric material utilizing another wet etch process. Air gap openings are then provided within the first region of the interconnect dielectric material, wherein during the providing the air gap openings the damaged regions are removed and a remaining portion of the sacrificial nitride layer is removed from atop the second region of the interconnect dielectric material. A dielectric capping layer is then formed over the first region and the second region of the interconnect dielectric material, wherein portions of the dielectric capping layer seal the air gap openings forming air gaps within the first region of the interconnect dielectric material.

DESCRIPTION

Figure 1:
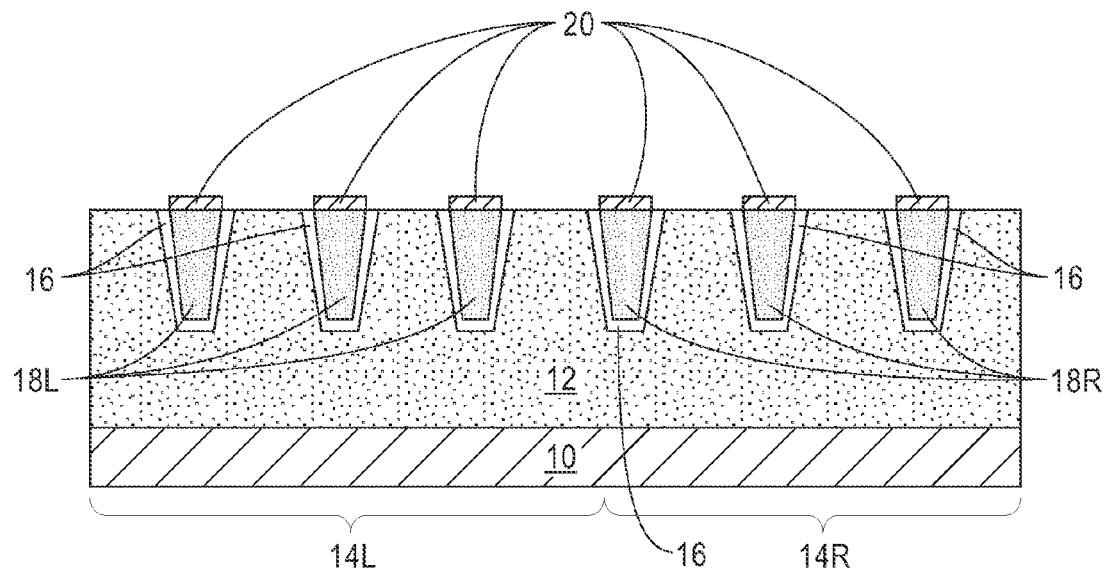
FIG. 1 is cross sectional view of an exemplary structure containing a plurality of first conductive metal structures located in a first region of an interconnect dielectric material and a plurality of second conductive metal structures located in a second region of the interconnect dielectric material in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary structure containing a plurality of first conductive metal structures 18L located in a first region 14L of an interconnect dielectric material 12 and a plurality of second conductive metal structures 18R located in a second region 14R of the interconnect dielectric material 12 in accordance with an embodiment of the present application.

In some embodiments of the present application and as illustrated in FIG. 1, a substrate 10 is located directly beneath the interconnect dielectric material 12. When present, the substrate 10 may include a semiconductor material, an insulating material, a conductive material or any combination including multilayers thereof. When the substrate 10 includes a semiconductor material, any semiconductor such as Si, SiGe, SiGeC, SiC, Ge alloys, an III/V compound semiconductor such as, for example, GaAs, InAs, and InP, or an II/VI compound semiconductor may be used. In addition to these listed types of semiconductor materials, the present application also contemplates cases in which the semiconductor substrate is a layered semiconductor such as, for example, Si/SiGe, Si/SiC, silicon-on-insulators (SOIs) or silicon germanium-on-insulators (SGOIs). When the substrate 10 is an insulating material, the insulating material can be an organic insulator, an inorganic insulator or any combination thereof including multilayers. When the substrate 10 is a conducting material, the substrate 10 may include, for example, polySi, an elemental metal, alloys of elemental metals, a metal silicide, a metal nitride or combinations thereof including multilayers. When the substrate 10 comprises a semiconducting material, one or more semiconductor devices such as, for example, complementary metal oxide semiconductor (CMOS) devices can be fabricated thereon. When the substrate 10 comprises a combination of an insulating material and a conductive material, the substrate may represent a lower interconnect level of a multilayered interconnect structure.

The interconnect dielectric material 12 that can be employed in the present application may include any interlevel or intralevel dielectric material including inorganic dielectric materials, organic dielectric materials, or combinations thereof. The interconnect dielectric material 12 may be porous, non-porous or contain regions and/or surfaces that are porous and other regions and/or surfaces that may be non-porous. Some examples of suitable dielectrics that can be used as the interconnect dielectric material 12 may include, but are not limited to, porous silicon oxide, carbon-doped silicon oxide, fluorine-doped silicon oxide, a silsesquioxane such as, for example methyl silsesquioxane (MSQ) and hydrogen silsesquioxane (HSQ), a C doped oxide (i.e., an organosilicate) that include atoms of Si, C, O and H, SiLK™, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In some embodiments of the present application, the interconnect dielectric material 12 has a dielectric constant that is less than 4.0, with a dielectric constant of 3.0 or less being even more typical. All dielectric constants mentioned herein are relative to a vacuum, unless otherwise noted. Dielectric materials that have dielectric constants of 3.0 or less generally have a lower parasitic cross talk as compared with dielectric materials that have a dielectric constant of 4.0 or greater. In one embodiment of the present application, the interconnect dielectric material 12 may have a thickness from 50 nm to 1000 nm. Other thicknesses that are lesser than or greater than the aforementioned thickness range may also be employed for the interconnect dielectric material 12. The interconnect dielectric material 12 can be formed utilizing a deposition process. Examples of suitable deposition process that can be used in forming the interconnect dielectric material 12 include, but are not limited to, chemical vapor deposition (CVD), plasma enhanced chemical vapor deposition (PECVD), evaporation, chemical solution deposition or spin-on coating.

After forming the interconnect dielectric material 12, the plurality of first conductive metal structures 18L and the plurality of second conductive metal structures 18R are formed into the respective regions 14L, 14R of the interconnect dielectric material 12.

The plurality of first conductive metal structures 18L and the plurality of second conductive metal structures 18R can be formed by first providing a blanket layer of a hard mask material (not shown) on an exposed surface of interconnect dielectric material 12. The blanket layer of hard mask material may comprise an oxide, nitride, oxynitride or multilayers thereof (e.g., a hard mask material stack composed of a pad oxide and a pad nitride). In some embodiments, the blanket layer of hard mask material may be composed of a semiconductor oxide, a semiconductor nitride and/or a semiconductor oxynitride. In one example, the blanket layer of hard mask material may be composed of silicon oxide and/or silicon nitride.

In some embodiments, the blanket layer of hard mask material may be formed by a deposition process. Examples of deposition processes that may be used in forming the blanket layer of hard mask material include, but are not limited to, CVD, PECVD, evaporation, chemical solution deposition, physical vapor deposition (PVD) or atomic layer deposition. In other embodiments, the blanket layer of hard mask material can be formed by a thermal process such as, for example, a thermal oxidation, a thermal nitridation and/or a thermal oxynitridation process. In yet other embodiments, the blanket layer of hard mask material can be formed utilizing a combination of deposition and thermal processes. That is, a thermal oxidation process may be used to form a sacrificial oxide material, followed by CVD to form a sacrificial nitride material.

After forming the blanket layer of hard mask material, lithography and etching can be used to form a plurality of openings (not shown) through the blanket layer of hard mask material and into at least a portion of the interconnect dielectric material 12. In some embodiments (not shown), the plurality of openings can extend entirely through the interconnect dielectric material 12. In other embodiments, the plurality of openings can extend partially through the interconnect dielectric material 12. In yet other embodiments, a first set of openings can extend completely through the interconnect dielectric material 12, while a second set of openings may extend partially through the interconnect dielectric material 12.

The lithographic step that can be used in forming the plurality of openings may include forming a photoresist (organic, inorganic or hybrid) atop the blanket layer of hard mask material by a deposition process. Examples of deposition processes that can be used in forming the photoresist include, for example, CVD, PECVD or spin-on coating. Following formation of the photoresist, the photoresist can be exposed to a desired pattern of irradiation. Next, the exposed photoresist can be developed utilizing a resist development process well known to those skilled in the art. After the development step, an etching step is performed to transfer the pattern from the patterned photoresist into the blanket layer of hard mask material and thereafter into the interconnect dielectric material 12. The patterned photoresist is typically removed from the surface of the structure after transferring the pattern into the blanket layer of hard mask material utilizing a conventional resist stripping process such as, for example, ashing. The remaining hard mask material is then used as an etch mask during the subsequent transferring of the pattern into the interconnect dielectric material 12. The etching step used in forming the plurality of openings may include a dry etching process (including reactive ion etching, ion beam etching, plasma etching or laser ablation), a wet chemical etching process or any combination thereof. In one example, a reactive ion etching is used to form the plurality of openings.

After forming the plurality of openings, a diffusion barrier liner 16 is typically formed into each opening. The diffusion barrier liner 16 includes a diffusion barrier material that is formed on the exposed surfaces of the remaining portions of the blanket layer of hard mask material and on exposed surfaces of the interconnect dielectric material 12 within each opening.

The diffusion barrier material that can be employed in forming the diffusion barrier liner 16 may be composed of Ta, TaN, Ti, TiN, Co, Ru, RuN, RuTa, RuTaN, IrTa, IrTaN, W, WN or any other material that can serve as a barrier to prevent conductive material from diffusing there through. The thickness of the diffusion barrier material used in forming the diffusion barrier liner 16 may vary depending on the deposition process used as well as the material employed. In one embodiment of the present application, the diffusion barrier material that forms the diffusion barrier liner 16 has a thickness from 4 nm to 38 nm. Other thicknesses that are lesser than or greater than the aforementioned thickness range can also be employed for the diffusion barrier material. The diffusion barrier material that forms the diffusion barrier liner 16 may be formed by a deposition process. Examples of deposition processes that can be used in forming the diffusion barrier material include, but are not limited to, CVD, PECVD, PVD, sputtering or plating.

Next, a conductive material comprising a conductive metal or metal alloy is formed on the exposed surfaces of the diffusion barrier material. A planarization process such as, for example, chemical mechanical polishing and/or grinding can be used to remove portions of the diffusion barrier material, the conductive material and remaining portions of the blanket layer of hard mask material from the topmost surface of the interconnect dielectric material 12. The remaining portions of diffusion barrier material can be referred to herein as diffusion barrier liner 16, while the remaining portions of the conductive material can be referred to herein can be referred to as conductive metal structures. Those conductive metal structures that are present in a first region 14L of the interconnect dielectric material 12 are referred to herein as a plurality of first conductive metal structures 18L, while those conductive metal structures that are present in a second region 14R are referred to herein as a plurality of second conductive metal structures 18R.

The conductive material used in forming the conductive metal structures 18L, 18R includes, for example, Cu, W, Al, or alloys thereof. In one particular embodiment of the present application, Cu or a Cu alloy (such as AlCu or CuMn) is used as the conductive material that forms the conductive metal structures 18L, 18R. The conductive material that is used in forming the conductive metal structures 18L, 18R can be formed utilizing a deposition process. Deposition processes that can be used in forming the conductive material include, but are not limited to, CVD, PECVD, PVD, sputtering, plating, chemical solution deposition or electroless plating.

Still referring to FIG. 1, a metal cap 20 can be formed on an exposed topmost surface of each conductive metal structure 18L, 18R and, optionally, on exposed surfaces of the diffusion barrier liner 16. In some embodiments, the metal cap 20 is formed only on the exposed surface of the conductive metal structures 18L, 18R. In other embodiments, the metal cap 20 is formed on exposed surfaces of both the conductive metal structures 18L, 18R and the diffusion barrier liner 16. In the drawings, the metal cap 20 is illustrated as being present only on the topmost surface of each conductive metal structure 18L, 18R. The metal cap 20 that can be employed in the present application includes any metal or metal alloy that is more resistant to corrosion or oxidation than the underlying conductive material that provides the conductive metal structure 18L, 18R. In one embodiment of the present application, the metal cap 20 includes Ru, Ir, Rh, Mn Pt, Co, W or alloys thereof. In another embodiment, the metal cap 20 may comprise a Co(W,P, B) alloy. In some embodiments, the metal cap 20 may comprise a single layer of metal. In other embodiments, the metal cap 20 may comprise a plurality of metal layers. In some cases, Co is selected as the material for the metal cap 20. The metal cap 20 can be formed by a deposition process. Examples of deposition processes that can be used in forming the metal cap 20 include, but are not limited to, CVD, PECVD, ALD or electroless deposition.

In some embodiments, the metal cap 20 has a topmost surface that extends above a topmost surface of the interconnect dielectric material 12. In other embodiments, the metal cap 20 has a topmost surface that is coplanar with a topmost surface of the interconnect dielectric material 12. In such an embodiment, a recess etch is performed to remove an upper portion of at least the conductive metal structures 18L, 18R and thereafter the metal cap 20 is formed on the recessed surface of the conductive metal structures 18L, 18R.

Figure 2:
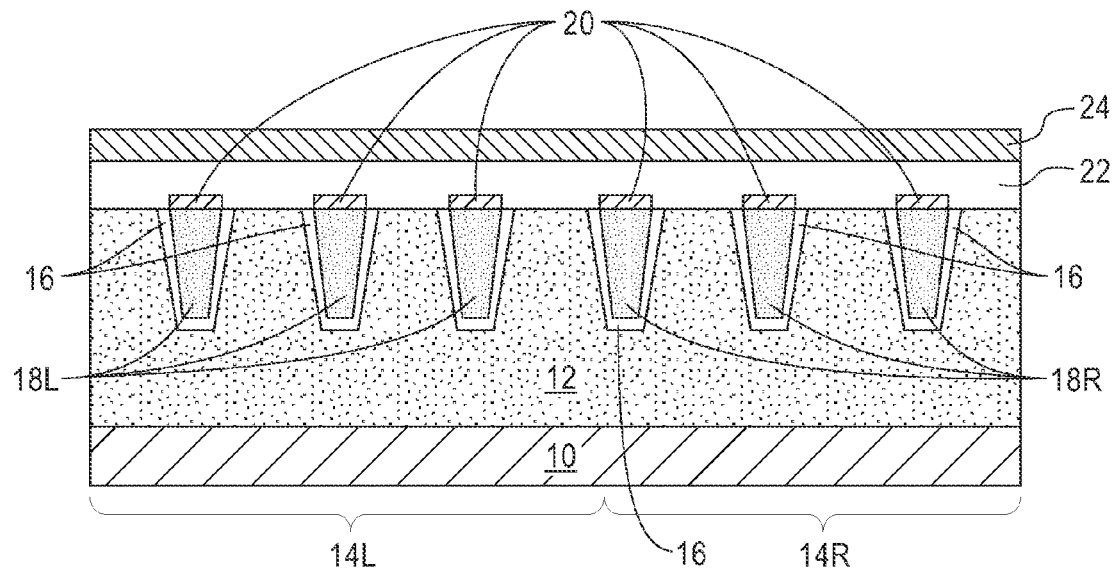
FIG. 2 is a cross sectional view of the exemplary structure of FIG. 1 after forming a masking material stack comprising, from bottom to top, a sacrificial nitride layer and a titanium nitride hard mask layer.

Referring now to FIG. 2, there is illustrated the exemplary structure of FIG. 1 after forming a masking material stack comprising, from bottom to top, a sacrificial nitride layer 22 and a titanium nitride hard mask layer 24. As shown, a bottommost surface of the masking material stack, i.e., a bottommost surface of the sacrificial nitride layer 22, is in direct physical contact with an exposed topmost surface of the metal cap 20, the exposed surface of the diffusion barrier liner 16 and the exposed surface of the interconnect dielectric material 12. The masking material stack (22, 24) is thus present over the plurality of first conductive metal structures 18L within the first region 14L of the interconnect dielectric material 12, and over the plurality of second conductive metal structures 18R within the second region 14R of the interconnect dielectric material 12.

The sacrificial nitride layer 22 of the masking material stack includes a nitride layer that has a high etch rate in a dilute HF etchant of from 0.4 nm/sec to 4.0 nm/sec. In one embodiment of the present application, the sacrificial nitride layer 22 comprises a semiconductor nitride such as, for example, silicon nitride. The sacrificial nitride layer 22 can be formed utilizing one of the deposition techniques mentioned above in forming the blanket layer of hard mask material. In one embodiment of the present application, the sacrificial nitride layer 22 has a thickness from 10 nm to 100 nm. Other thicknesses for the sacrificial nitride layer 22 that are lesser than or greater than the aforementioned thickness range may also be employed in the present application.

After providing the sacrificial nitride layer 22, the titanium nitride hard mask layer 24 is formed directly on an exposed topmost surface of the sacrificial nitride layer 22 and thus forms a material interface with the underlying sacrificial nitride layer 22. The titanium nitride hard mask layer 24 can be formed utilizing a deposition process such as, for example, CVD, PECVD, ALD, sputtering, or physical vapor deposition (PVD). The thickness of the titanium nitride hard mask layer 24 can be from 10 nm to 100 nm, although lesser and greater thicknesses can also be employed in the present application.

Figure 3:
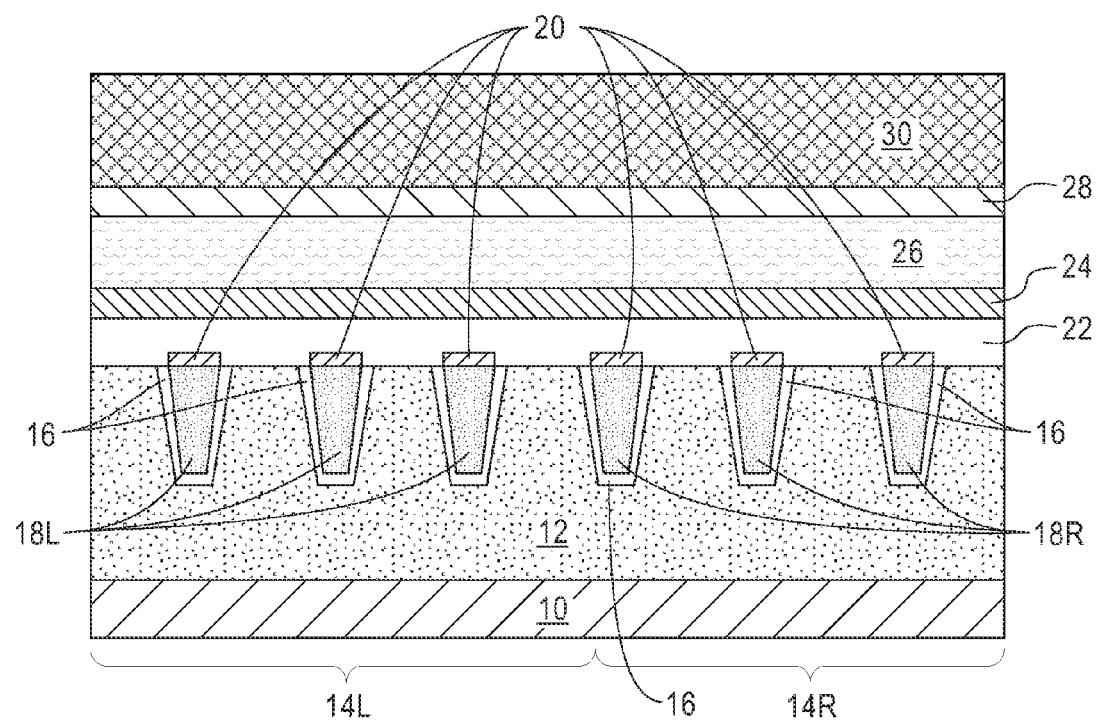
FIG. 3 is a cross sectional view of the exemplary structure of FIG. 2 after forming a lithographic patterning material stack comprising, from bottom to top, an organic planarization layer (OPL), an antireflective coating (ARC) layer and a photoresist layer.

Referring now to FIG. 3, there is illustrated the exemplary structure of FIG. 2 after forming a lithographic patterning material stack comprising, from bottom to top, an organic planarization layer (OPL) 26, an antireflective coating (ARC) layer 28 and a photoresist layer 30. In some embodiments of the present application, the ARC layer 28 can be omitted from the lithographic patterning material stack. In some embodiments, the OPL 26 may be omitted. As is shown, a bottommost surface of the lithographic patterning material stack, i.e., the OPL 26, is in direct physical contact with a topmost surface of the masking material stack, i.e., the titanium nitride hard mask layer 24.

The OPL 26 of the lithographic patterning material stack typically includes a material that is composed mainly of C, H and O (near frictionless carbon is one example) and it has etch properties that are similar to that of a photoresist material. The OPL 26 can be formed utilizing a deposition process such as, for example, CVD, PECVD, evaporation or spin-on coating. The thickness of the OPL 26 can be from 30 nm to 300 nm, although lesser and greater thicknesses can also be employed.

The ARC layer 28 can include any antireflective coating material known in the art, and can have a thickness from 10 nm to 200 nm, although lesser and greater thicknesses can also be employed. In one example, the ARC layer 28 is composed of a Si-containing ARC material. The ARC layer 28 can be formed utilizing a deposition process including, for example, CVD, PECVD, evaporation or spin-on coating.

The photoresist layer 30 may comprise a positive-tone photoresist material, a negative-tone photoresist material or a hybrid photoresist material as are conventional and known in the art. The photoresist layer 30 can be formed by a deposition process such as, for example, CVD, PECVD, evaporation or spin-on coating. The thickness of the photoresist layer 30 can be from 20 nm to 300 nm, although lesser and greater thicknesses can also be employed.

Figure 4:
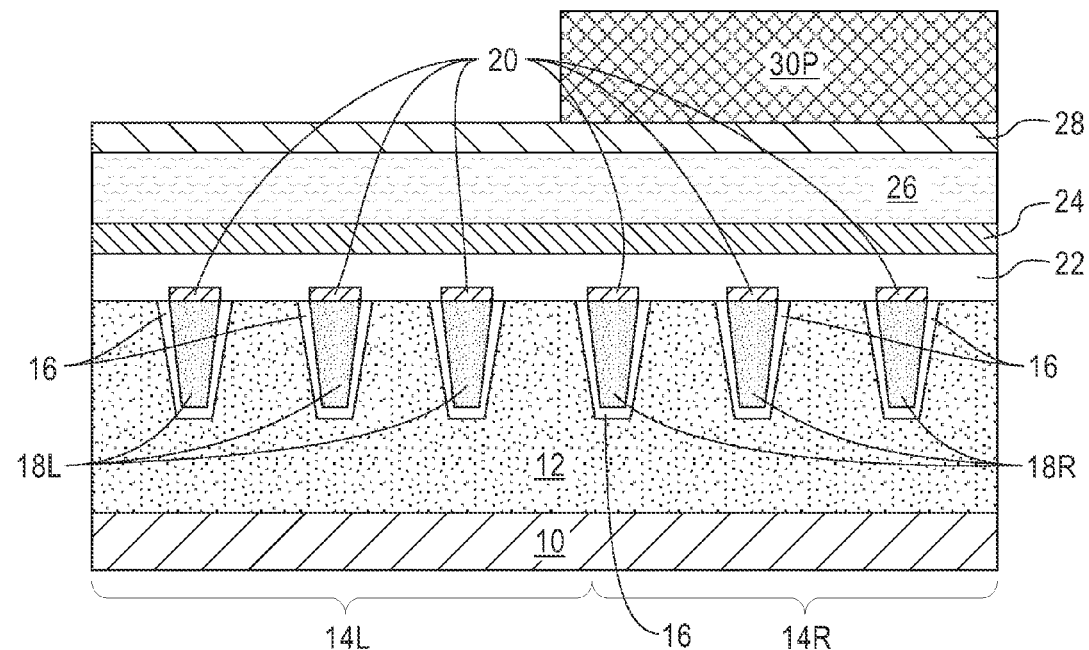
FIG. 4 is a cross sectional view of the exemplary interconnect structure of FIG. 3 after lithographically patterning the photoresist layer to provide a photoresist portion located over the second region of the interconnect dielectric material, but not the first region of the interconnect dielectric material.

Referring now to FIG. 4, there is illustrated the exemplary interconnect structure of FIG. 3 after lithographically patterning the photoresist layer 30 to provide a photoresist portion 30P located over the second region 14R of the interconnect dielectric material 12, but not the first region 14R of the interconnect dielectric material 12. Lithographical patterning of the photoresist layer 30 includes exposing the photoresist layer 30 to a desired pattern of irradiation and thereafter developing the photoresist material.

Figure 5:
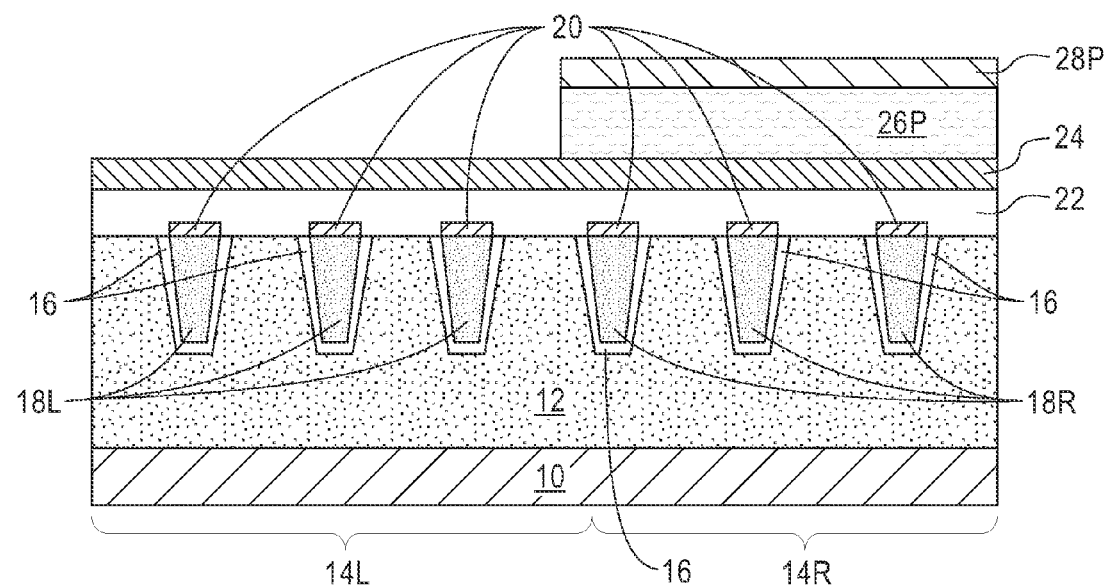
FIG. 5 is a cross sectional view of the exemplary structure of FIG. 4 after performing an etch process to remove exposed portions of the ARC layer and OPL from atop the first region of the interconnect dielectric material.

Referring now to FIG. 5, there is illustrated the exemplary structure of FIG. 4 after performing an etch process to remove exposed portions of the ARC layer 28 and the OPL 26 from atop the first region 14L of the interconnect dielectric material 12. During the OPL 26 removal, the photoresist portion 30P is simultaneously removed from the structure. That is, FIG. 5 illustrates the structure of FIG. 4 after transferring the pattern into the ARC layer 28 and the OPL 26 within the first region 14L of the interconnect dielectric material 12. As is shown, a remaining portion of the ARC layer 28 and a remaining portion of the OPL 26 are present over the second region 14R of the interconnect dielectric material 12. The remaining portion of the ARC layer 28 can be referred to hereinafter as ARC portion 28P, while the remaining portion of the OPL 26 can be referred to hereinafter as OPL portion 26P.

The etch process used to transfer the pattern into the ARC layer 28 and the OPL 26 can include an anisotropic dry etching process such as, for example, reactive ion etching, ion beam etching, plasma etching or laser ablation. A single dry etch process or multiple dry etch processes can be used to provide the structure shown in FIG. 5. As is shown, this step of the present application exposes a topmost surface of the titanium nitride hard mask layer 24 over the first region 14L of the interconnect dielectric material 12.

Figure 6:
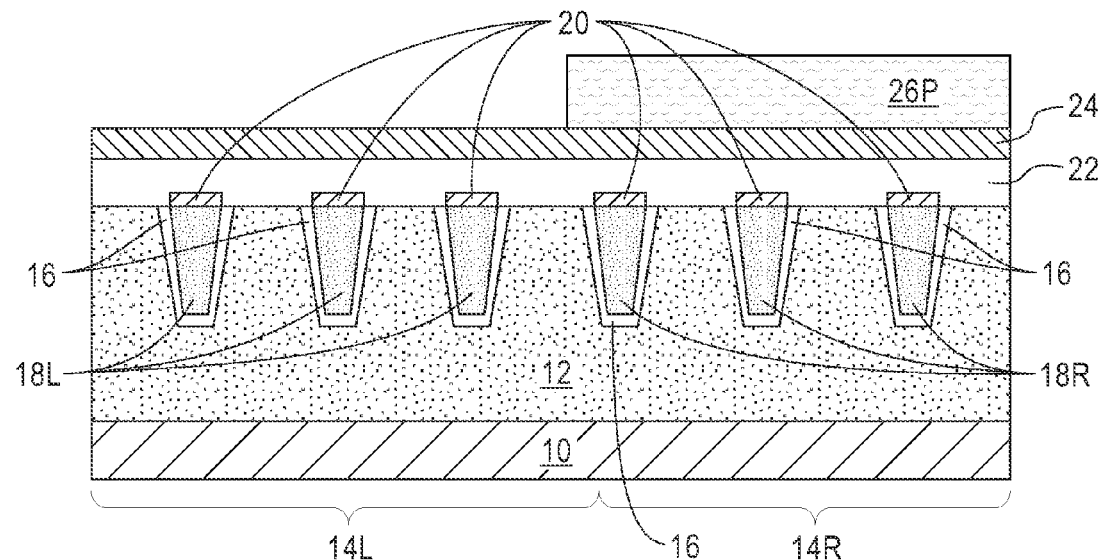
FIG. 6 is a cross sectional view of the exemplary structure of FIG. 5 after removing a remaining portion of the ARC layer from atop the second region of the interconnect dielectric material.

Referring now to FIG. 6, there is illustrated the exemplary structure of FIG. 5 after removing a remaining portion of the ARC layer, i.e., ARC portion 28P, from atop the second region 14R of the interconnect dielectric material 12. As is shown in FIG. 6, OPL portion 26P remains over the second region 14R of the interconnect dielectric material at this point of the present application. The ARC portion 28P can be removed by employing an isotropic etch or by planarization.

Figure 7:
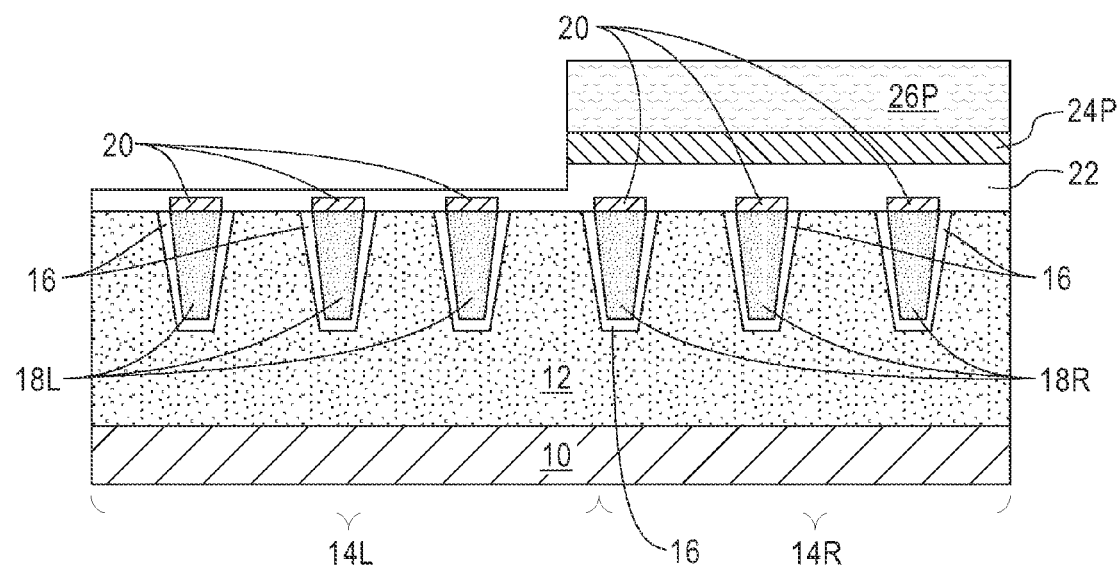
FIG. 7 is a cross sectional view of the exemplary structure of FIG. 6 after removing the titanium nitride hard mask layer from atop the first region of the interconnect dielectric material utilizing a remaining portion of the OPL over the second region of the interconnect dielectric material as a mask.

Referring now to FIG. 7, there is illustrated the exemplary structure of FIG. 6 after removing the titanium nitride hard mask layer 24 from atop the first region 14L of the interconnect dielectric material 12 utilizing a remaining portion of the OPL, i.e., OPL portion 26P, over the second region 14R of the interconnect dielectric material 12 as a mask. A portion of the titanium nitride hard mask layer 24 remains over the second region 14R of the interconnect dielectric material 12. The remaining portion of the titanium nitride hard mask layer can be referred to herein as titanium nitride hard mask portion 24P.

The removal of the titanium nitride hard mask layer 24 from atop the first region 14L of the interconnect dielectric material 12 comprises an etch that selectively removes the exposed portions of the titanium nitride hard mask layer 24 relative to the materials of the OPL portion 26P and the underlying sacrificial nitride layer 22. In one embodiment of the present application, a dry etching process such as reactive ion etching can be used to remove the titanium nitride hard mask layer 24 from atop the first region 14L of the interconnect dielectric material 12. In another embodiment of the present application, a wet etch can be used to remove the titanium nitride hard mask layer 24 from atop the first region 14L of the interconnect dielectric material 12. In such an embodiment, the wet etch may constituent an alkaline solution (SC-1) including an aqueous mixture of ammonium hydroxide and hydrogen peroxide (e.g., 1:1:5 of 30% $H_2O_2$, 28% $NH_4OH$ and $H_2O$). Other peroxide based etchants such as, for example, tetraethyl ammonium hydroxide (TEAH) and tetramethyl ammonium hydroxide (TMAH) may also be used in the present application.

In some embodiments (not shown), the etch used to remove the titanium nitride hard mask layer 24 from atop the first region 14L of the interconnect dielectric material 12 stops on the topmost surface of the underlying sacrificial nitride layer 22. In other embodiments, and as shown, the etch used to remove the titanium nitride hard mask layer 24 from atop the first region 14L of the interconnect dielectric exposes a sub-surface of the sacrificial nitride layer 22. By "sub-surface" it meant a surface of the material layer that is located beneath the original topmost surface of the material.

Figure 8:
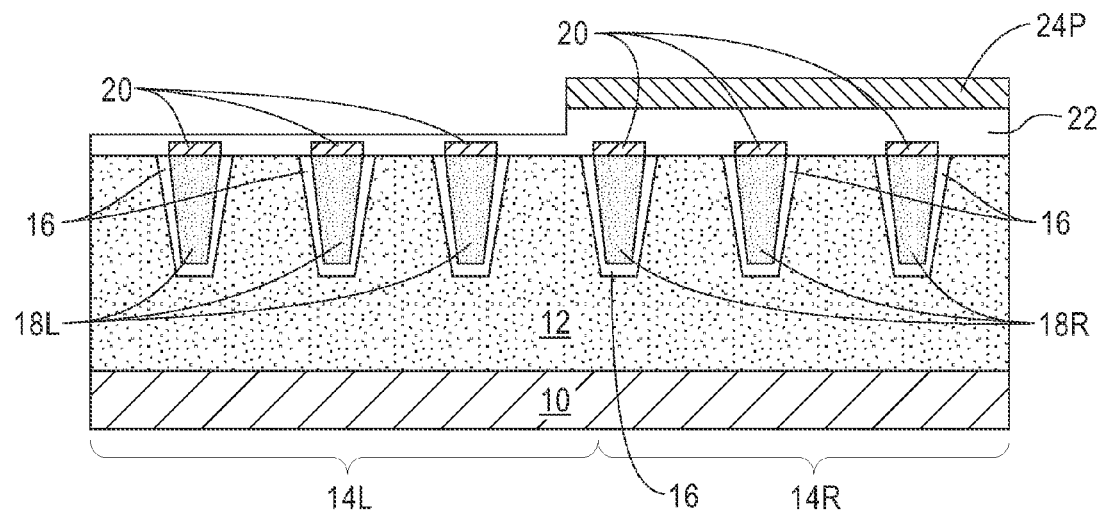
FIG. 8 is a cross sectional view of the exemplary structure of FIG. 7 after removing the remaining portion of the OPL from over the second region of the interconnect dielectric material.

Referring now to FIG. 8, there is illustrated the exemplary structure of FIG. 7 after removing the remaining portion of the OPL, i.e., OPL portion 26P, from over the second region 14R of the interconnect dielectric material 12. As shown in FIG. 8, the topmost surface of the titanium nitride hard mask portion 24P is now exposed after removing the OPL portion 26P. The OPL portion 26P can be removed by employing an isotropic etch or by planarization.

Figure 9:
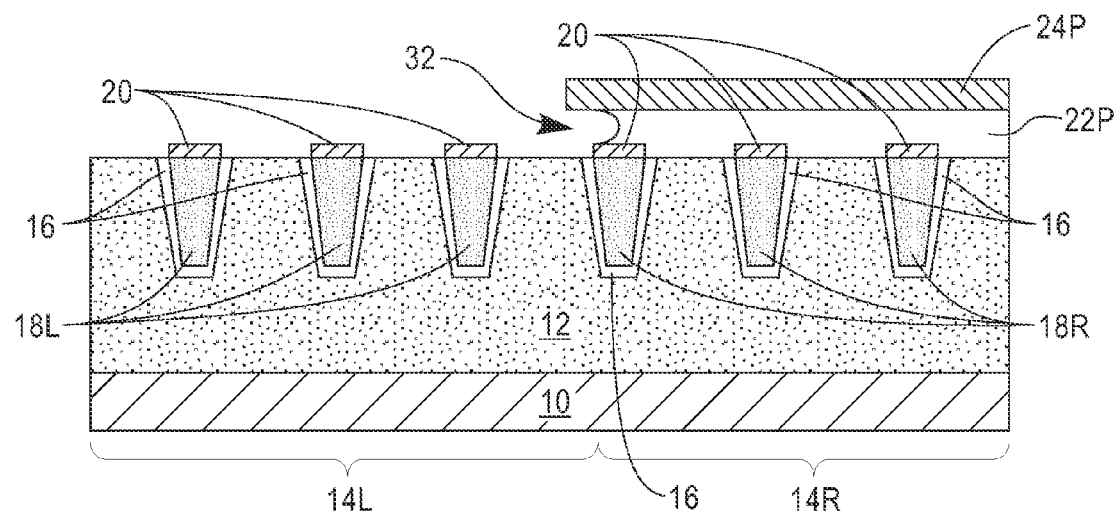
FIG. 9 is a cross sectional view of the exemplary structure of FIG. 8 after removing the sacrificial nitride layer from atop the first region of the interconnect dielectric material utilizing a remaining portion of the titanium nitride hard mask layer over the second region of the interconnect dielectric material as a mask.

Referring now to FIG. 9, there is illustrated the exemplary structure of FIG. 8 after removing the sacrificial nitride layer 22 from atop the first region 14L of the interconnect dielectric material 12 utilizing a remaining portion of the titanium nitride hard mask layer, i.e., titanium nitride hard mask portion 24P, that is located over the second region 14R of the interconnect dielectric material 12 as a mask. During this step of the present application, the topmost surface of the interconnect dielectric material 12 and the metal caps 20 that are located within the first region 14L are now exposed.

In some embodiments and as shown in FIG. 9, an undercut region 32 may form directly beneath the titanium nitride hard mask portion 24P that is located over the second region 14R of the interconnect dielectric material 12 during this step of the present application; the undercut region 32 forms as a result of removing a sidewall portion of a remaining portion of the sacrificial nitride layer (hereinafter sacrificial nitride portion 22P) that is located directly beneath the titanium nitride hard mask portion 24P and located over the second region 14R of the interconnect dielectric material 12. The formation of the undercut region 32 results in a sacrificial nitride portion 22P that has a non-vertical sidewall surface.

The removal of the sacrificial nitride layer 22 from atop the first region 14L of the interconnect dielectric material 12 can be performed utilizing a diluted HF solution that has a concentration of water to HF in a ratio range from 100:1 to 1300:1. In some embodiments of the present application, the etch in this diluted HF solution can be performed at nominal room temperature (i.e., from 20° C. to 30° C.). In other embodiments, the etch can be performed at a temperature from greater than 30° C. to less than the boiling point of the diluted HF solution.

Figure 10:
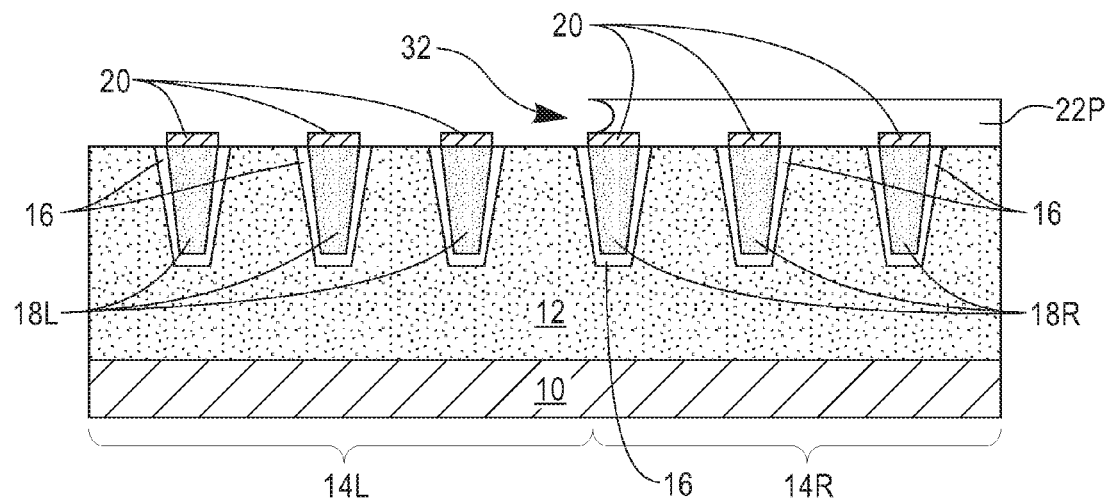
FIG. 10 is a cross sectional view of the exemplary structure of FIG. 9 after removing the remaining portion of the titanium nitride hard mask layer from over the second region of the interconnect dielectric material.

Referring now to FIG. 10, there is illustrated the exemplary structure of FIG. 9 after removing the remaining portion of the titanium nitride hard mask layer, i.e., titanium nitride hard mask portion 24P, from over the second region 14R of the interconnect dielectric material 12. As shown in FIG. 10, the sacrificial nitride portion 22P remains over the top of the second region 14R of the interconnect dielectric material 12 after removing the titanium nitride hard mask portion 24P.

The titanium nitride hard mask portion 24P can be removed utilizing a wet etch process in which a peroxide etchant is employed. This etch selectively removes the titanium nitride hard mask portion 24P without adversely attacking the exposed metal caps 22 and the exposed topmost surface of the interconnect dielectric material 12. In one embodiment, the etchant used during wet etching of the titanium nitride hard mask portion 24P may include an alkaline solution (SC-1) including an aqueous mixture of ammonium hydroxide and hydrogen peroxide (e.g., 1:1:5 of 30% $H_2O_2$, 28% $NH_4OH$ and $H_2O$). Tetraethyl ammonium hydroxide (TEAH) and tetramethyl ammonium hydroxide (TMAH) may also be employed in the present application.

Figure 11:
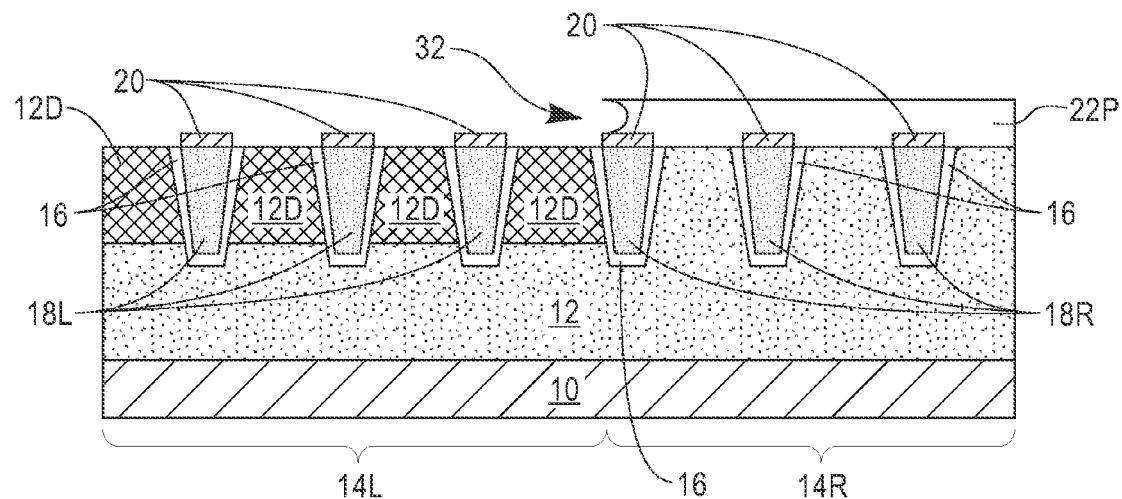
FIG. 11 is a cross sectional view of the exemplary semiconductor structure of FIG. 10 after damaging regions of the interconnect dielectric material within the first region utilizing the remaining portion of the sacrificial nitride layer located over the second region of the interconnect dielectric material as a mask.

Referring now to FIG. 11, there is illustrated the exemplary semiconductor structure of FIG. 10 after damaging regions of the interconnect dielectric material 12 within the first region 14L utilizing the remaining portion of the sacrificial nitride layer, i.e., sacrificial nitride portion 22P, that is located over the second region 14R of the interconnect dielectric material 12 as a mask. The damaged regions that are located within the first region 14L of the interconnect dielectric material 12 are labeled as element 12D in the drawing. By "damaged regions" it is meant a region of a dielectric material that has been modified such that the modified dielectric material can be selectively removed relative to the non-modified dielectric material in an etchant that includes a diluted HF solution that has a concentration of water to HF within a range of 100:1 or less. In some embodiments, and when C is present in the interconnect dielectric material 12, this step of the present application forms damaged regions 12D within the interconnect dielectric material 12 that have a lower content of C than the original interconnect dielectric material. In one embodiment of the present application, the damaged regions 12D can be formed by subjecting the structure shown in FIG. 10 to an $H_2$—$N_2$ or $NH_3$ containing plasma.

Figure 12:
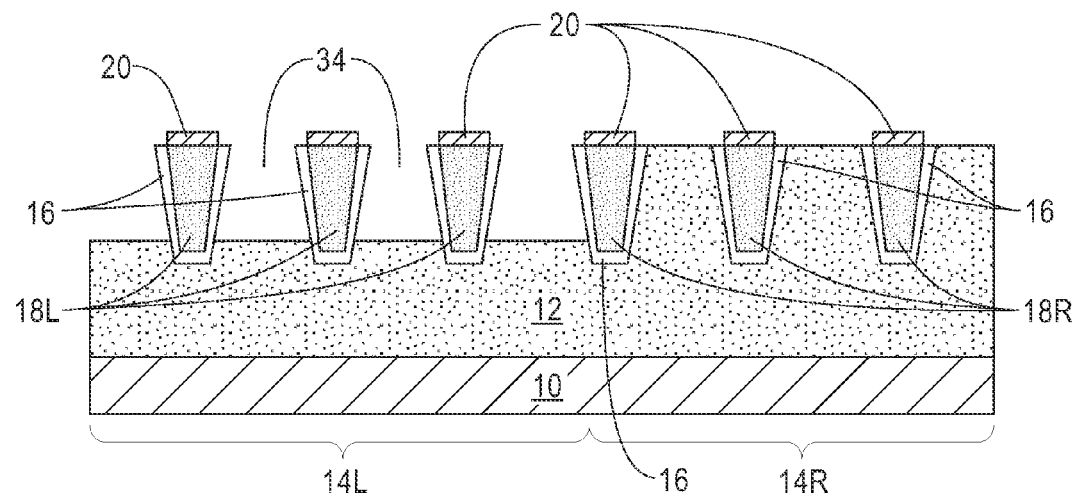
FIG. 12 is a cross sectional view of the exemplary semiconductor structure of FIG. 11 after removing the damaged regions of the interconnect dielectric, wherein during the removing of the damaged regions the remaining portion of the sacrificial nitride layer located over the second region of the interconnect dielectric material is also removed.

Referring now to FIG. 12, there is illustrated the exemplary semiconductor structure of FIG. 11 after removing the damaged regions 12D of the interconnect dielectric material 12, wherein during the removing of the damaged regions 12D the remaining portion of the sacrificial nitride layer (i.e., sacrificial nitride portion 22P) that is located over the second region 14R of the interconnect dielectric material 12 is also removed.

The removal of the damaged regions 12D and the sacrificial nitride portion 22P can be performed utilizing a diluted HF solution that has a concentration of water to HF in a ratio range of from 100:1 or less. In some embodiments of the present application, the etch in this diluted HF solution can be performed at nominal room temperature (i.e., from 20° C. to 30° C.). In other embodiments, the etch can be performed at a temperature from greater than 30° C. to less than the boiling point of the diluted HF solution.

As is shown, air gap openings 34 are formed in the volume that was previously occupied by the damaged regions 12D of the interconnect dielectric material 12. As shown, the air gap openings 34 expose at least a sidewall surface of the diffusion barrier liner 16. The air gap openings 34 can have various depths, and, in some embodiments, can extend below the bottommost surface of the openings previously formed into the interconnect dielectric material 12 which now house the plurality of first conductive metal structures 18L.

Figure 13:
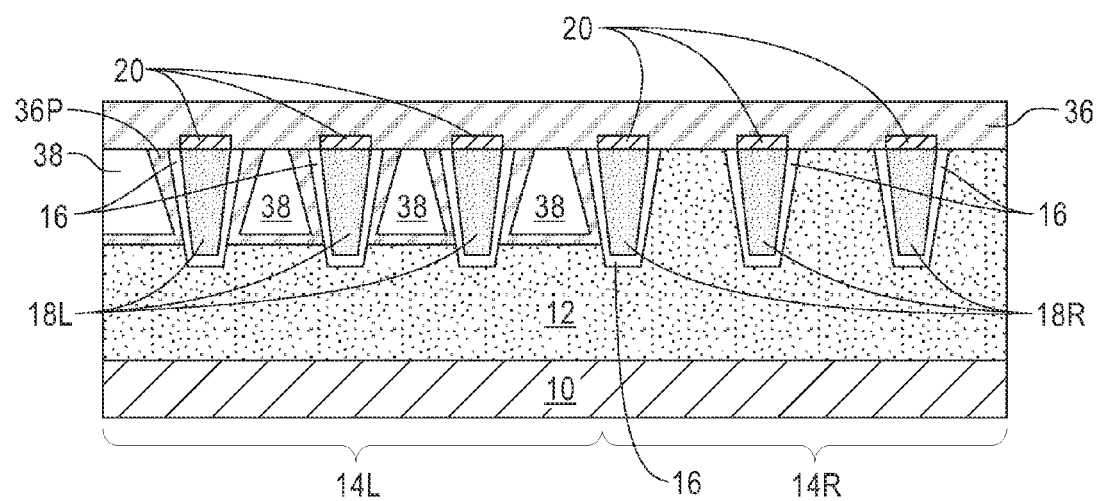
FIG. 13 is a cross sectional view of the exemplary semiconductor structure of FIG. 12 after forming a dielectric capping layer over the first and second regions of the interconnect dielectric material, wherein air gaps are formed in the first region of the interconnect dielectric material.

Referring now to FIG. 13, there is illustrated the exemplary semiconductor structure of FIG. 12 after forming a dielectric capping layer 36 over the first and second regions 14L, 14R of the interconnect dielectric material 12, wherein air gaps 38 are formed in the first region 14L of the interconnect dielectric material 12. The air gaps 38 are formed by sealing the topmost portion of each of the air gap openings 34 with the dielectric capping layer 36. During formation of dielectric capping layer 36, portions of the dielectric capping material (herein after dielectric material portion 36P) also forms within the air gap openings 34 as shown in FIG. 13.

The dielectric capping layer 36 and dielectric material portion 36P may include any dielectric capping material. In some embodiments, the dielectric capping layer 36 and dielectric material portion 36P may include a same dielectric material as the interconnect dielectric material 12. In another embodiment of the present application, the dielectric capping layer 36 and dielectric material portion 36P comprise a different dielectric material than the interconnect dielectric material. Some examples of dielectric capping materials that can be employed as the dielectric capping layer 36 and dielectric material portion 36P include, but are not limited to, SiC, SiN, $SiO_2$, SiNO, a carbon doped oxide, a nitrogen and hydrogen doped silicon carbide SiC(N,H) or multilayers thereof. In some embodiments, the dielectric capping layer 36 and dielectric material portion 36P include a non-graded dielectric capping material. In other embodiments, the dielectric capping layer 36 and dielectric material portion 36P include a graded dielectric capping material; grading is typically in the vertical direction. The dielectric capping layer 36 and dielectric material portion 36P can be formed by a deposition process such as described above in forming the interconnect dielectric material. The thickness of the dielectric capping layer 36 and dielectric material portion 36P can be from 10 nm to 150 nm. Other thickness that are lesser than or greater than the aforementioned thickness range can also be employed as the thickness of the dielectric capping layer 36 and dielectric material portion 36P.

Figure 14:
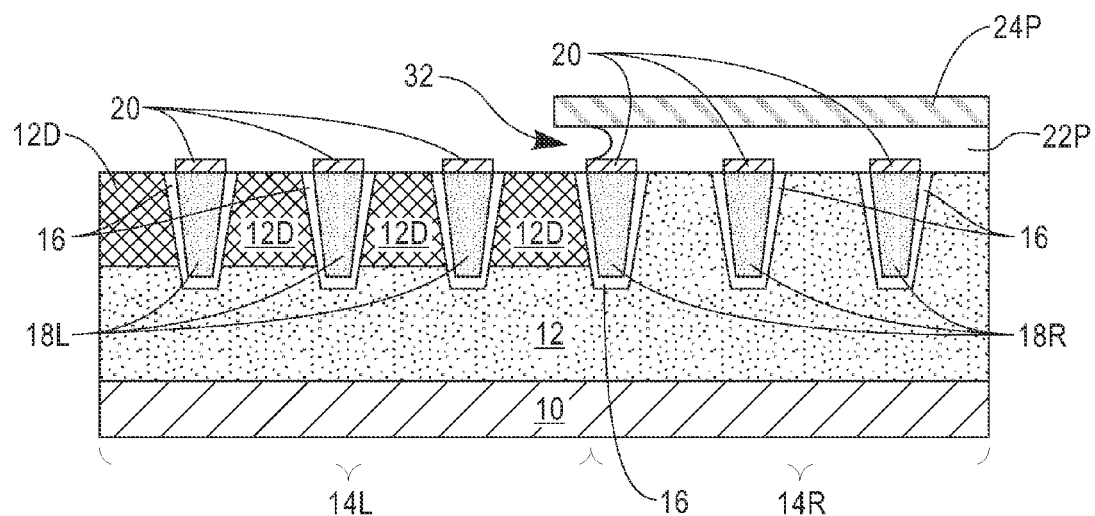
FIG. 14 is a cross sectional view of the exemplary semiconductor structure of FIG. 9 after damaging regions of the interconnect dielectric material within the first region utilizing the remaining portions of the titanium nitride hard mask layer and the sacrificial nitride layer located over the second region of the interconnect dielectric material as a mask in accordance with another embodiment of the present application.

Referring now to FIG. 14, there is illustrated the exemplary semiconductor structure of FIG. 9 after damaging regions (i.e., forming damaged regions 12D) of the interconnect dielectric material 12 located in the first region 14L utilizing the remaining portions of the titanium nitride hard mask layer (i.e., titanium nitride portion 24P) and the sacrificial nitride layer (i.e., sacrificial nitride portion 22P) located over the second region 14R of the interconnect dielectric material 12 as a mask in accordance with another embodiment of the present application. The damaged regions 12D can be formed as described above.

Figure 15:
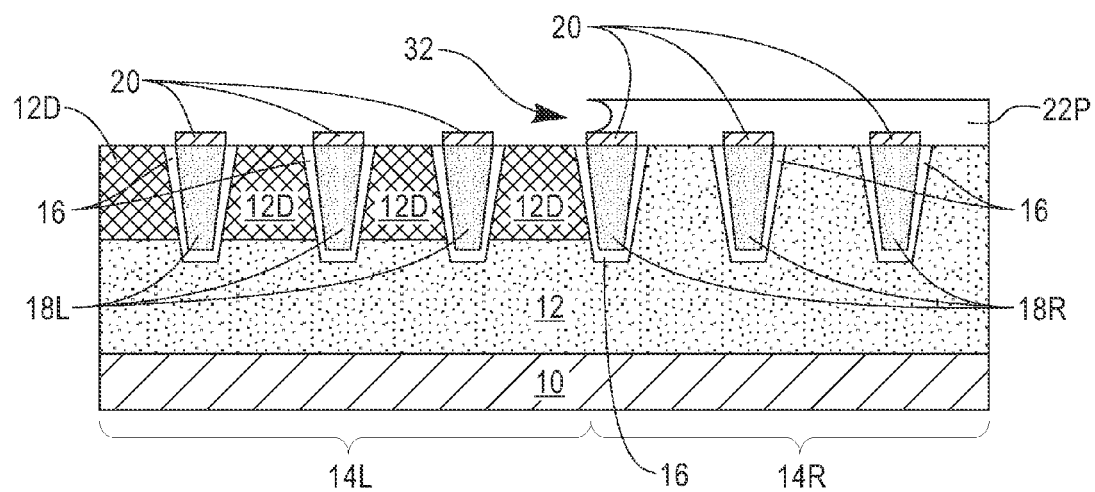
FIG. 15 is a cross sectional view of the exemplary structure of FIG. 14 after removing the remaining portion of the titanium nitride hard mask layer from over the second region of the interconnect dielectric material.

Referring now to FIG. 15, there is illustrated the exemplary structure of FIG. 14 after removing the remaining portion of the titanium nitride hard mask layer (i.e., titanium nitride portion 24P) from over the second region 14R of the interconnect dielectric material 12. The removal of the titanium nitride portion 24P is performed utilizing the wet etch process mentioned above in providing the structure shown in FIG. 10. The structure shown in FIG. 15 can then be processed as described above in providing the structures shown in FIGS. 12 and 13 of the present application.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming an interconnect structure containing air gaps, said method comprising
   providing a structure having a plurality of first conductive metal structures located in a first region of an interconnect dielectric material and a plurality of second conductive metal structures located in a second region of said interconnect dielectric material;
   forming a masking material stack comprising, from bottom to top, a sacrificial nitride layer and a titanium nitride hard mask layer over said structure;
   removing said titanium nitride hard mask layer from over said first region, but not said second region, of said interconnect dielectric material;
   removing said sacrificial nitride layer from over said first region of said interconnect dielectric material utilizing a wet etch process, wherein a remaining portion of said titanium nitride hard mask layer located over said second region of said interconnect dielectric material serves as a mask during said wet etch process;
   removing said remaining portion of said titanium nitride hard mask layer over said second region of said interconnect dielectric material utilizing another wet etch process;
   providing air gap openings within said first region of said interconnect dielectric material, wherein during said providing said air gap openings a remaining portion of said sacrificial nitride layer is removed from atop said second region of said interconnect dielectric material; and
   forming a dielectric capping layer over said first region and said second region of said interconnect dielectric material, wherein portions of said dielectric capping layer seal said air gap openings forming air gaps within said first region of said interconnect dielectric material.

2. The method of claim 1, further comprising a metal cap located over each of said first and second plurality of conductive metal structures and a diffusion barrier liner located between each of said first and second plurality of conductive metal structures and said interconnect dielectric material.

3. The method of claim 1, wherein said removing said titanium nitride hard mask layer from over said first region comprising:
   forming a lithographic patterning material stack on a topmost surface of said masking material stack, said lithographical lithographic patterning material stack comprises, from bottom to top, an organic planarization layer (OPL), an antireflective coating (ARC) layer and a photoresist layer;
   patterning said photoresist layer by lithography to provide a photoresist portion over said second region of said interconnect dielectric material;
   removing said ARC layer and said OPL which are present atop said first region of said interconnect dielectric material by etching;
   removing a remaining portion of said ARC layer from over said second region of said interconnect dielectric material; and
   etching an exposed portion of said titanium nitride hard mask layer over said first region of said interconnect dielectric material utilizing a remaining portion of said OPL that is present over said second region of said interconnect dielectric material as a mask.

4. The method of claim 3, wherein said etching said exposed portion of said titanium nitride hard mask layer comprises a dry etch process or a chemical wet etch process.

5. The method of claim 3, wherein during said etching said exposed portion of said titanium nitride hard mask layer a sub-surface of said sacrificial nitride layer located over said first region of said interconnect dielectric material is exposed.

6. The method of claim 1, wherein said wet etch process comprises a diluted HF solution that has a concentration of water to HF in a ratio range from 100:1 to 1300:1.

7. The method of claim 1, wherein during said wet etch process an undercut region is formed beneath said remaining portion of the titanium nitride hard mask layer that is present over said second region of said interconnect dielectric material.

8. The method of claim 7, wherein said undercut region exposes a non-vertical sidewall surface of said remaining portion of said sacrificial nitride layer.

9. The method of claim 1, wherein said another wet etch process comprises a peroxide etchant.

10. The method of claim 9, wherein said peroxide etchant comprises an aqueous mixture of ammonium hydroxide and hydrogen peroxide.

11. The method of claim 1, wherein said providing said air gap openings and said removing said remaining portion of said sacrificial nitride layer comprises:
    forming damaged regions in said first region of said interconnect dielectric material; and
    etching said damaged regions and said remaining portion of said remaining portion of said sacrificial nitride layer utilizing a diluted HF solution that has a concentration of water to HF in a ratio range of from 100:1 or less.

12. The method of claim 11, wherein said damaged regions have a carbon content that is less than a carbon content of said interconnect dielectric material.

13. The method of claim 11, wherein said damaged regions are formed utilizing a $H_2$—$N_2$ or $NH_3$ containing plasma.

14. The method of claim 2, wherein said air gaps directly contact sidewall surfaces of said diffusion barrier liner.

15. A method of forming an interconnect structure containing air gaps, said method comprising
    providing a structure having a plurality of first conductive metal structures located in a first region of an interconnect dielectric material and a plurality of second conductive metal structures located in a second region of said interconnect dielectric material;
    forming a masking material stack comprising, from bottom to top, a sacrificial nitride layer and a titanium nitride hard mask layer over said structure;
    removing said titanium nitride hard mask layer from over said first region, but not said second region, of said interconnect dielectric material;

removing said sacrificial nitride layer from over said first region of said interconnect dielectric material utilizing a wet etch process, wherein a remaining portion of said titanium nitride hard mask layer located over said second region of said interconnect dielectric material serves as a mask during said wet etch process;

forming damaged regions within said first region of said interconnect dielectric material;

removing said remaining portion of the titanium nitride hard mask layer from over the second region of the interconnect dielectric material utilizing another wet etch process;

providing air gap openings within said first region of said interconnect dielectric material, wherein during said providing said air gap openings said damaged regions are removed and a remaining portion of said sacrificial nitride layer is removed from atop said second region of said interconnect dielectric material; and forming a dielectric capping layer over said first region and said second region of said interconnect dielectric material, wherein portions of said dielectric capping layer seal said air gap openings forming air gaps within said first region of said interconnect dielectric material.

16. The method of claim 15, wherein said wet etch process comprises a diluted HF solution that has a concentration of water to HF in a ratio range from 100:1 to 1300:1, wherein during said wet etch process an undercut region is formed beneath said remaining portion of the titanium nitride hard mask layer that is present over said second region of said interconnect dielectric material.

17. The method of claim 15, wherein during said wet etch process an undercut region is formed exposes a non-vertical sidewall surface of said remaining portion of said sacrificial nitride layer.

18. The method of claim 15, wherein said another wet etch process comprises a peroxide etchant.

19. The method of claim 15, wherein said damaged regions and said remaining portion of said remaining portion of said sacrificial nitride layer are removed utilizing a diluted HF solution that has a concentration of water to HF in a ratio range 100:1 or less.

* * * * *